US011514709B2

(12) United States Patent
Yao et al.

(10) Patent No.: US 11,514,709 B2
(45) Date of Patent: Nov. 29, 2022

(54) BIOMETRIC IDENTIFICATION DEVICE USING A LIGHT DETECTION APPARATUS WITH LIGHT BLOCKING LAYER/DIAPHRAGM

(71) Applicant: SHENZHEN GOODIX TECHNOLOGY CO., LTD., Shenzhen (CN)

(72) Inventors: Guofeng Yao, Shenzhen (CN); Jian Shen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 238 days.

(21) Appl. No.: 16/890,024

(22) Filed: Jun. 2, 2020

(65) Prior Publication Data

US 2020/0293740 A1    Sep. 17, 2020

Related U.S. Application Data

(63) Continuation of application No. PCT/CN2019/076569, filed on Feb. 28, 2019.

(51) Int. Cl.
*H01L 27/146*    (2006.01)
*G06V 10/145*    (2022.01)
(Continued)

(52) U.S. Cl.
CPC ........ *G06V 40/1318* (2022.01); *G06V 10/145* (2022.01); *H01L 27/14621* (2013.01); *H01L 27/14623* (2013.01); *H01L 27/14627* (2013.01); *H01L 27/14636* (2013.01); *H01L 27/14678* (2013.01); *G06V 40/10* (2022.01)

(58) Field of Classification Search
CPC ......... H01L 27/14621; H01L 27/14627; H01L 27/14623; H01L 27/14636; H01L 27/14678; H01L 27/14625; H01L 21/02425; H01L 21/02502; H01L 31/02162; H01L 31/02164; H01L 31/0543;
(Continued)

(56) References Cited

U.S. PATENT DOCUMENTS 6,878,922 B1    4/2005  Bohn
10,216,975 B1 *  2/2019  He ...................... H01L 27/3244
(Continued)

FOREIGN PATENT DOCUMENTS

CN    1258055 A    6/2000
CN    2473636 Y    1/2002
(Continued)

*Primary Examiner* — Jennifer D Bennett
*Assistant Examiner* — Erin R Garber
(74) *Attorney, Agent, or Firm* — Scully Scott Murphy & Presser (57) ABSTRACT

Provided are an optical image capturing unit and an electronic device. The optical image capturing unit includes: an optical converging device; a diaphragm disposed on a back focal plane of the optical converging device, where the diaphragm is provided with a window; and a photosensing unit disposed under the diaphragm, where the optical converging device is configured to converge an optical signal within a specific incident angle range to the window, and the optical signal is transmitted to the photosensing unit via the window.

14 Claims, 4 Drawing Sheets

(51) Int. Cl.
*G06V 40/10* (2022.01)
*G06V 40/13* (2022.01)

(58) Field of Classification Search
CPC .. G06V 40/1318; G06V 10/145; G06V 40/10; G06V 40/1324; G06V 40/45
See application file for complete search history.

(56) References Cited

U.S. PATENT DOCUMENTS

| | | | |
|---|---|---|---|
| 10,636,931 B1* | 4/2020 | Shibata | ............. H01L 31/02164 |
| 10,990,790 B2* | 4/2021 | Chien | ................ G06V 40/1318 |
| 2015/0187980 A1 | 7/2015 | Yamamoto | |
| 2017/0103248 A1 | 4/2017 | Yamamoto | |
| 2019/0026523 A1 | 1/2019 | Shen et al. | |
| 2019/0205592 A1 | 7/2019 | Cao et al. | |
| 2019/0228200 A1 | 7/2019 | Chung et al. | |
| 2019/0252439 A1* | 8/2019 | Ogawa | ............. H01L 31/02164 |
| 2020/0126920 A1* | 4/2020 | Huang | ............. H01L 27/14621 |

FOREIGN PATENT DOCUMENTS

| | | | | |
|---|---|---|---|---|
| CN | 106228147 A | | 12/2016 | |
| CN | 107480579 A | | 12/2017 | |
| CN | 108073912 A | | 5/2018 | |
| CN | 207851852 U | | 9/2018 | |
| CN | 108734073 A | | 11/2018 | |
| CN | 109313704 A | * | 2/2019 | ........... G02B 3/0056 |
| CN | 109313704 A | | 2/2019 | |

* cited by examiner

BIOMETRIC IDENTIFICATION DEVICE USING A LIGHT DETECTION APPARATUS WITH LIGHT BLOCKING LAYER/DIAPHRAGM

CROSS-REFERENCE TO RELATED APPLICATIONS

This application is a continuation of International Application No. PCT/CN2019/076569, filed on Feb. 28, 2019, the disclosure of which is hereby incorporated by reference in its entirety.

TECHNICAL FIELD

Embodiments of the present application relate to the technical field of image capturing, and more particularly, to an optical image capturing unit, an optical image capturing system, and an electronic device.

BACKGROUND

With rapid development of terminal industry, biometric identification technology has received more and more attention from people, and there is also an increasing demand for performance of under-screen biometric identification technology, such as under-screen fingerprint identification technology.

Current under-screen fingerprint identification technology includes two main types. First, fingerprint identification technology based on an array of collimating holes is included. Specifically, the array of collimating holes is composed of periodically distributed collimating holes. A ratio of aperture diameter to aperture depth of a collimating hole is referred to as an aspect ratio. An optical resolution of an under-screen fingerprint identification apparatus based on an array of collimating holes is determined by a period and an aspect ratio of the collimating hole, which results in that the under-screen fingerprint identification apparatus based on the array of collimating holes has a larger size. Second, under-screen fingerprint identification technology based on pinhole imaging is included. An under-screen fingerprint identification apparatus based on a pinhole imaging principle requires a lens module to achieve under-screen fingerprint detection, which also results in that the entire under-screen fingerprint identification apparatus has a larger thickness, and cannot be applied to an electronic device that has requirements for thickness and size.

SUMMARY

Embodiments of the present application provide an optical image capturing unit, optical image capturing system and electronic device, which is beneficial to reducing a thickness of a fingerprint identification apparatus using the optical image capturing system.

In a first aspect, provided is an optical image capturing unit, including: an optical converging device;
a diaphragm disposed on a back focal plane of the optical converging device, where the diaphragm is provided with a window; and
a photosensing unit disposed under the diaphragm,
where the optical converging device is configured to converge an optical signal within a specific incident angle range to the window, and the optical signal is transmitted to the photosensing unit via the window.

In some possible implementation manners, a focal point of the optical converging device is located in the window.

In some possible implementation manners, the window is not directly facing an optical axis of the optical converging device.

In some possible implementation manners, the specific incident angle range is $\theta \pm \Delta\theta$, where $\theta$ is not equal to zero, and $\Delta\theta$ is determined according to a size of the window.

In some possible implementation manners, the optical image capturing unit further includes:
a first dielectric layer configured to transmit an optical signal and disposed under the optical converging device.

In some possible implementation manners, the optical image capturing unit further includes:
a metal layer and a second dielectric layer disposed between the diaphragm and the photosensing unit, where the metal layer and the second dielectric layer include a connection circuit of the photosensing unit.

In some possible implementation manners, the first dielectric layer is disposed between the optical converging device and the diaphragm and in the window.

In some possible implementation manners, the optical image capturing unit further includes:
a second dielectric layer disposed above the photosensing unit, where a metal layer in the second dielectric layer is provided with a window, and the metal layer is used as the diaphragm.

In some possible implementation manners, the first dielectric layer is disposed between the optical converging device and the second dielectric layer.

In some possible implementation manners, the first dielectric layer is provided with a light shielding layer, and the light shielding layer is configured to shield an incident optical signal from an adjacent optical image capturing unit.

In some possible implementation manners, the optical image capturing unit further includes:
a filter disposed above the photosensing unit for filtering out an optical signal of a non-target wavelength band and transmitting an optical signal of a target wavelength band.

In some possible implementation manners, the filter is disposed between the optical converging device and the diaphragm, or the filter is disposed above the optical converging device.

In some possible implementation manners, the filter includes:
a first filter layer disposed on an upper surface of a substrate; and/or
a second filter layer disposed on a lower surface of the substrate.

In some possible implementation manners, the optical signal detected by the photosensing unit is used to form a pixel of a captured image.

In some possible implementation manners, the optical converging device is a convex lens or a Fresnel lens.

In some possible implementation manners, a distance by which the window deviates from an optical axis of the optical converging device is set such that a parallel optical signal within the specific incident angle range passes through the window.

In a second aspect, provided is an optical image capturing system, including: an array of a plurality of the optical image capturing units in the first aspect or any possible implementation manner of the first aspect.

In some possible implementation manners, the optical image capturing system further includes:
a light shielding layer disposed between optical converging devices of adjacent optical image capturing units, and configured to shield an incident optical signal from an adjacent optical image capturing unit.

In some possible implementation manners, the optical image capturing system further includes:

a support structure for supporting the optical image capturing system.

In some possible implementations, the optical image capturing system is a biometric identification system or a camera system.

In a third aspect, provided is an electronic device, including: a display screen and the optical image capturing system in the second aspect or any possible implementation manner of the second aspect, where the optical image capturing system is disposed under the display screen.

In some possible implementations, the display screen is an organic light-emitting diode display screen, and a light-emitting layer of the display screen includes a plurality of organic light-emitting diode light sources, where when the optical image capturing system is a biometric identification system, the biometric identification system employs at least some of the organic light-emitting diode light sources as an excitation light source for biometric identification.

DESCRIPTION OF EMBODIMENTS

Technical solutions in embodiments of the present application will be described hereinafter in conjunction with the accompanying drawings.

The technical solutions in the embodiments of the present application can be applied to various electronic devices, for example, portable or mobile computing devices such as a smart phone, a notebook computer, a tablet computer and a game device, and other electronic devices such as an electronic database, an automobile and an automated teller machine (ATM), which is not limited in the embodiments of the present application.

The technical solutions in the embodiments of the present application may be used for under-screen optical image capturing, for example, under-screen biometric identification or hidden under-screen camera function, and the biometric identification may include other biometric identification in addition to fingerprint identification, for example, living body identification, which is not limited in the embodiments of the present application. In order to facilitate understanding of the technical solutions of the embodiments of the present application, under-screen biometric identification technology is first introduced below.

Figure 1:
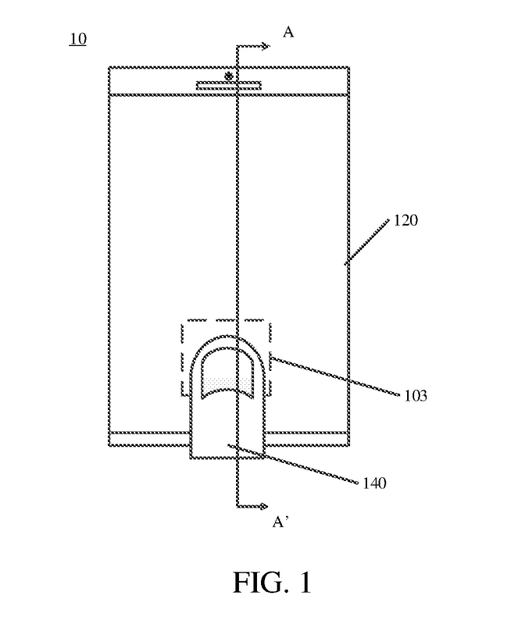
FIG. 1 is a schematic plan view of an electronic device to which the present application is applicable.
Figure 2:
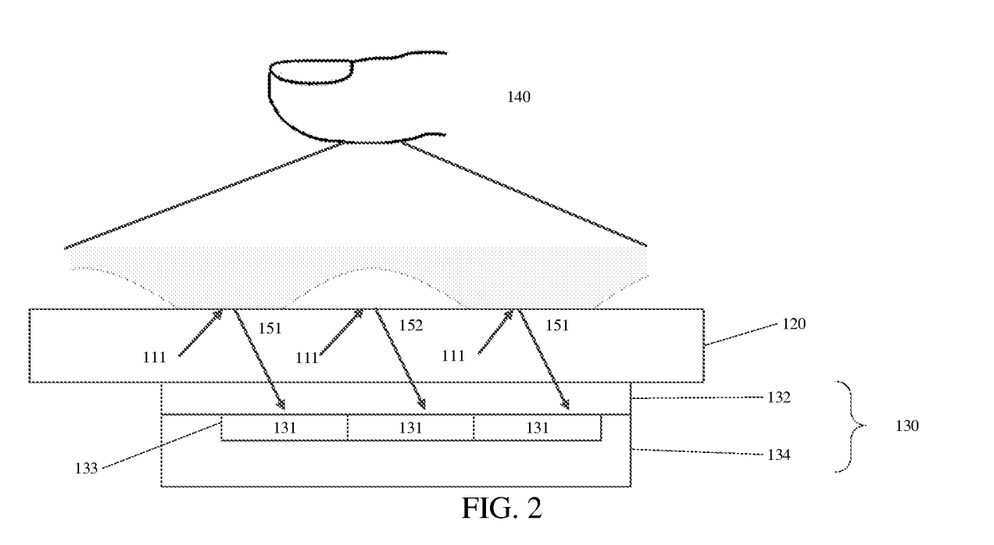
FIG. 2 is a partial schematic cross-sectional view of the electronic device shown in FIG. 1 taken along A-A'.

FIG. 1 and FIG. 2 are schematic views showing an electronic device 10 to which under-screen biometric identification technology is applicable. FIG. 1 is a schematic front view of an electronic device 10, and FIG. 2 is a partial schematic cross-sectional structural view of the electronic device 10 shown in FIG. 1 taken along A-A'.

As shown in FIG. 1 and FIG. 2, the electronic device 10 includes a display screen 120 and a biometric identification apparatus 130, and the biometric identification apparatus 130 is disposed in a partial region under the display screen 120, for example, under a middle region of the display screen. The biometric identification apparatus 130 may be specifically an optical biometric identification module, such as an optical fingerprint module, which is mainly used for capturing biometric information (such as fingerprint image information) of a user. In the embodiments of the present application, the biometric identification apparatus 130 may be disposed at least in a partial region under the display screen 120 such that a biometric capturing region (or sensing region) 103 of the biometric identification apparatus 130 is at least partially located in a display region of the display screen 120.

As an embodiment, the biometric identification apparatus 130 may include an optical image capturing system which may include a plurality of optical image capturing units, and more specifically, the optical image capturing system of the biometric identification apparatus 130 may include an optical image sensor having an optical sensing array 133, such as a CMOS image sensor and a CCD image sensor; the optical sensing array includes a plurality of photosensing units 131, one of the photosensing units 131 corresponds to one of the optical image capturing units of the above optical image capturing system; and the optical image capturing units may specifically include photodetectors or photosensors. Optionally, the photodetectors may include a PN junction photodiode, a photogate, an avalanche photodiode, a phototransistor, a photoconductive detector, and the like, and an area where the optical sensing array is located corresponds to the biometric capturing region 103 of the biometric identification apparatus 130. As shown in FIG. 1, the biometric capturing region 103 is located in the display region of the display screen 120. Therefore, when a user needs to unlock the electronic device 10 or perform other biometric verification, a biometric input operation can be implemented merely by pressing a finger on the biometric capturing region 103 of the display screen 120. Since biometric capturing and detection can be implemented in the display region of the display screen 120, there is no need for a front surface of the electronic device 10 in the above structure to exclusively reserve space to set a fingerprint button (such as a Home button), so that a full screen solution can be adopted. Therefore, the display region of the display screen 120 can be substantially extended to the entire front surface of the electronic device 10.

As an optional implementation manner, as shown in FIG. 2, the biometric identification apparatus 130 includes a light detecting portion 134 and an optical component 132. The light detecting portion 134 includes an optical sensing array, as well as an amplifying circuit, a readout circuit and other auxiliary circuits electrically connected to the optical sensing array, and may be fabricated on a die such as an optical imaging chip or an optical image sensor by a semiconductor process. The sensing array is specifically a photodetector (PD) array including a plurality of photodetectors distributed in an array. The optical component 132 may be disposed above the sensing array of the light detecting portion 134, and may specifically include a filter layer, a light directing layer or a light path directing structure, and other optical elements. The filter layer may be used to filter ambient light penetrating a finger, and the light directing layer or the light path directing structure is mainly used to direct reflected light reflected from a finger surface to the optical sensing array for optical detection.

As an example, in fingerprint capturing, the biometric identification apparatus 130 is an optical fingerprint apparatus 130, and the biometric capturing region 103 is a fingerprint detecting region 103. As an optional embodiment, the display screen 120 may adopt a display screen with a self-light-emitting display unit, such as an organic light-emitting diode (OLED) display screen or a micro light-emitting diode (Micro-LED) display screen. As an example, when an OLED display screen is adopted, the optical fingerprint apparatus 130 may use a display unit (that is, an OLED light source) of the OLED display screen 120 in the fingerprint detecting region 103 as an excitation light source for optical fingerprint detection. When a finger 140 is pressed against the fingerprint detecting region 103, the display screen 120 emits a beam of light 111 to the target finger 140 above the fingerprint detecting region 103, and the light 111 is reflected on a surface of the finger 140 to form reflected light or scattered inside the finger 140 to form scattered light. In related patent applications, the reflected light and the scattered light are collectively referred to as reflected light for convenience of description. Since a ridge and a valley of a fingerprint have different light reflecting capabilities, reflected light 151 from the ridge of the fingerprint and reflected light 152 from the valley of the fingerprint have different light intensities. After passing through the optical component 132, the reflected light is received by the sensing array 133 in the light detecting portion 134 and converted into the corresponding electrical signal, that is, a fingerprint detecting signal; and fingerprint image data may be obtained based on the fingerprint detecting signal, and fingerprint matching verification may be further performed, thereby implementing an optical fingerprint identification function in the electronic device 10.

In other embodiments, the optical fingerprint apparatus 130 may also use an internal light source or an external light source to provide an optical signal for fingerprint detection. In this case, the optical fingerprint apparatus 130 may be applied to a non-self-light-emitting display screen, such as a liquid crystal display screen or other passive light-emitting display screens. As an example, in a case of application to a liquid crystal display screen having a backlight module and a liquid crystal panel, in order to support under-screen fingerprint detection of the liquid crystal display screen, the optical fingerprint system of the electronic device 10 may further include an excitation light source for optical fingerprint detection. The excitation light source may specifically be an infrared light source or a light source of non-visible light at a specific wavelength, which may be disposed under the backlight module of the liquid crystal display screen or disposed in an edge region under a protective cover of the electronic device 10. The optical fingerprint apparatus 130 may be disposed under the liquid crystal panel or the edge region of the protective cover, and light for fingerprint detection may reach the light detecting portion 134 by being directed by a light path. Alternatively, the optical fingerprint apparatus 130 may also be disposed under the backlight module, and the backlight module allows the light for fingerprint detection to pass through the liquid crystal panel and the backlight module and reach the light detecting portion 134 by providing a hole on film layers such as a diffusion sheet, a brightening sheet, a reflection sheet or the like, or by performing other optical designs. In other alternative implementation manners, the display screen 120 may also adopt a non-self-light-emitting display screen, for example, a backlight liquid crystal display screen; in this case, the optical fingerprint apparatus 130 cannot adopt the display unit of the display screen 120 as an excitation light source; therefore, there is a need to integrate an excitation light source inside the optical fingerprint apparatus 130 or set an excitation light source outside the optical fingerprint apparatus 130 to achieve optical fingerprint detection. When the optical fingerprint apparatus 130 uses an internal light source or an external light source to provide an optical signal for fingerprint detection, a detection principle is consistent with the foregoing description.

It should be understood that, in specific implementation, the electronic device 10 further includes a transparent protective cover, and the cover may be a glass cover or a sapphire cover, which is located above the display screen 120 and covers a front surface of the electronic device 10. Therefore, in an embodiment of the present application, the so-called finger being pressed against the display screen 120 actually refers to being pressed against a cover above the display screen 120 or a surface of a protective layer covering the cover.

Due to factors such as space and imaging requirements, increasingly high design requirements are produced for an optical image capturing system in a biometric identification module. An embodiment of the present application provides an optical image capturing solution, which can be used for biometric identification and other applications that require optical image capturing.

Figure 3:
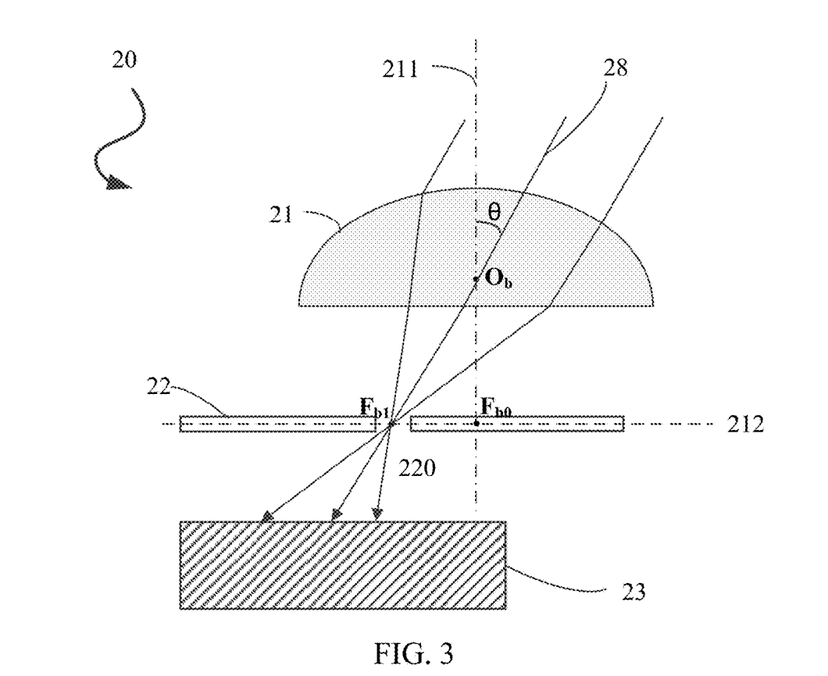
FIG. 3 is a schematic view of an optical image capturing unit according to an embodiment of the present application.

FIG. 3 illustrates a schematic view of an optical image capturing unit 20 according to an embodiment of the present application.

The optical image capturing unit 20 in FIG. 3 may constitute a pixel unit of an optical image capturing system, that is, an optical signal detected by the optical image capturing unit 20 is used to form a pixel of a captured image.

As shown in FIG. 3, the optical image capturing unit 20 may include:
an optical converging device 21;
a diaphragm 22 disposed on a back focal plane 212 of the optical converging device, where the diaphragm 22 is provided with a window 220; and
a photosensing unit 23 disposed under the diaphragm 22,
where the optical converging device 21 is configured to converge an optical signal 28 within a specific incident angle range to the window 220, and the optical signal is transmitted to the photosensing unit 23 via the window 220.

Optionally, in the embodiment of the present application, the optical converging device 21 may be configured as various structures or devices having an optical converging effect, such as a convex lens or a Fresnel lens. In a specific embodiment, the optical converging device 21 may be a plano-convex lens.

Optionally, in the embodiment of the present application, the diaphragm 22 may be configured as various structures or devices that play a limitation role on an optical signal. For example, the diaphragm 22 may be configured as a dark light absorbing coating, such as a coating formed of a black adhesive material, or the diaphragm 22 may also be configured as a light reflecting coating, such as a metal layer.

Optionally, in the embodiment of the present application, the optical signal detected by the photosensing unit 23 may be used to form a pixel of a captured image, and the pixel represents a feature value of the corresponding region above the optical image capturing unit 20. That is, a signal captured by one optical image capturing unit 20 forms one pixel of an image, and thus the whole image could be obtained by signals captured by a plurality of optical image capturing units 20.

In the embodiment of the present application, the optical converging device 21 may converge the optical signal within the specific incident angle range to the window 220, and further, the optical signal is transmitted to the photosensing unit 23 via the window 220. That is, the photosensing unit can only receive an incident optical signal within the specific incident angle range.

Optionally, a focal point of the optical converging device 21 is located in the window 220.

That is, the window 220 is configured to transmit the optical signal converged by the optical converging device 21.

As shown in FIG. 3, a back focal point (or referred to as an image-side focal point) $F_{b0}$ of the optical converging device 21 is an intersection point of a main optical axis 211 and the back focal plane (or referred to as an image-side focal surface) 212 of the optical converging device 21. When a beam of parallel light 28 is incident at an angle θ with the main optical axis, the parallel light 28 is converged to a focal point $F_{b1}$ on the back focal plane 212, and the focal point $F_{b1}$ is located in the window 220. Since a propagation direction of an incident light passing through an optical center $O_b$ of the optical converging device 21 is unchanged, a distance $F_{b0}F_{b1}$ between the focal point $F_{b1}$ and the back focal point $F_{b0}$ can have the following relation with an incident angle θ:

$$F_{b0}F_{b1} = OF_{b0} \tan\theta \qquad \text{Equation (1),}$$

where $OF_{b0}$ is a distance between the optical center $O_b$ and the back focal point $F_{b0}$, that is, a back focal distance of the optical converging device 21.

Optionally, if the optical converging device is a lens, a curvature radius of the lens is r, and a refractive index of the lens material is n, the Equation (1) can be converted into:

$$F_{b0}F_{b1} = \frac{r}{n-1}\tan\theta. \qquad \text{Equation (2)}$$

Since the window has a certain size, the incident angle range of the optical signal that the optical converging device can converge is actually θ±Δθ, where Δθ is determined according to the size of the window. Assuming a width of the window is D, Δθ can be:

$$\Delta\theta = \frac{1}{2}\left(\tan^{-1}\frac{(n-1)\left(F_{b0}F_{b1} + 0.5D\right)}{r} - \tan^{-1}\frac{(n-1)\left(F_{b0}F_{b1} - 0.5D\right)}{r}\right). \qquad \text{Equation (3)}$$

Therefore, in the case where parameters of the lens and a position of the window in the diaphragm are determined, the incident angle range for passing through the window can be determined according to the Equation (2) and the Equation (3). Conversely, by setting the position of the window in the diaphragm, the window can be controlled to only transmit an optical signal within a certain incident angle range.

Optionally, the window 220 is cylindrical, that is, a pinhole may be provided in the diaphragm 22. Optionally, the window 220 may have a diameter greater than a specific threshold, for example, 100 nm, so as to facilitate transmission of desired light for imaging. In addition, the diameter of the window 220 shall also be less than a certain threshold to ensure that the diaphragm 22 can shield undesired light. That is, the parameter setting of the window 220 enables the optical signal desired for imaging by the optical image capturing unit 20 to be maximally transmitted to the photosensing unit 23, while undesired light is maximally shielded.

Optionally, in some embodiments, the parameter of the window 220 may be set such that an optical signal incident at a certain tilting angle above the optical image capturing unit 20 is maximally transmitted to the photosensing unit 23, while other optical signals are maximally shielded.

For example, a center of the window 220 may be set not to directly face the optical axis 211 of the optical converging device 21, that is, the focal point $F_{b1}$ and the back focal point $F_{b0}$ are different points.

Alternatively, in other embodiments, the parameter of the window 220 may be set such that an optical signal incident vertically downward above the optical image capturing unit 20 is maximally transmitted to the photosensing unit 23, while other optical signals are maximally shielded.

For example, a center of the window 220 may be set to directly face the optical axis 211 of the optical converging device 21, that is, the focal point $F_{b1}$ and the back focal point $F_{b0}$ may be the same point.

In summary, by means of settings of the optical converging device 21, the diaphragm 22, the window 220 and the photosensing unit 23, the optical signal from above of the optical converging device 21 is converged to the window 220 and transmitted to the photosensing unit 23 through the window 220. In this way, the photosensing unit 23 can detect the optical signal from the corresponding region above the optical converging device 21, and thus can acquire a pixel value according to light intensity of the optical signal. Compared with an imaging system using a pinhole imaging principle, an optical image capturing system does not need to consider a setting such as an object distance, and thus can be set directly under a display screen without leaving a distance for imaging, which can reduce a thickness of a product.

Moreover, in the embodiment of the present application, the optical converging device 21 is used to only converge an optical signal within a specific incident angle range into the window. Compared with other fingerprint identification solutions, the optical converging device 21 can minimize interference of incident light at other angles to the largest extent and can improve an imaging quality.

In the embodiment of the present application, the optical image capturing system may include an array of a plurality of optical image capturing units. In this case, if the optical converging device is a micro lens, the optical image capturing system may include a micro lens array, a diaphragm array, and a photosensor (or referred to as an image sensor) including a plurality of photosensing units.

Optionally, in the embodiment of the present application, the photosensor is a complementary metal oxide semiconductor (CMOS), a charge-coupled device (CCD), a thin film transistor (TFT), a photodetector, etc. The embodiment of present application is not limited thereto.

Hereinafter, a specific structure of each optical image capturing unit will be described from the perspective of an optical image capturing system with reference to FIG. 4 to FIG. 7.

Figure 4:
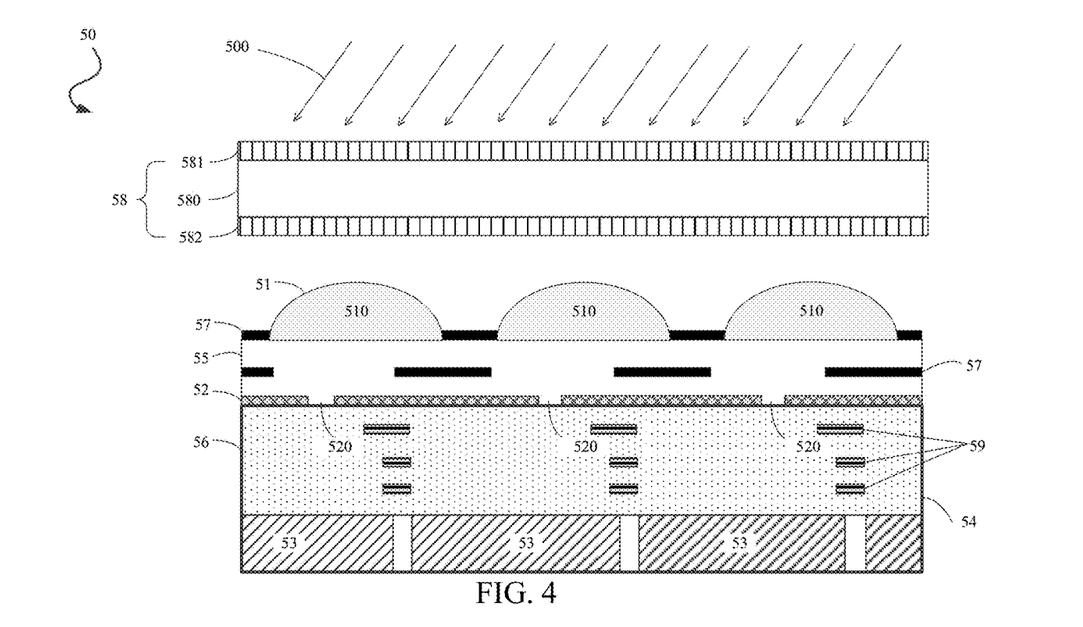
FIG. 4 is a schematic view of an optical image capturing system according to an embodiment of the present application.

FIG. 4 is a schematic structural view of an optical image capturing system 50 according to an embodiment of the present application. As shown in FIG. 4, the optical image capturing system 50 includes:

an optical converging device array 51 including a plurality of optical converging devices 510;

a diaphragm array 52 in which windows 520 are provided; and an optical image sensor 54 including a plurality of photosensing units 53.

The optical converging device 510, the window 520 and the photosensing unit 53 may correspond to the optical converging device 21, the window 220 and the photosensing unit 23 described above. For detailed description, reference may be made to the foregoing embodiment, and details are not described herein again.

Optionally, in some embodiments, the optical image capturing system 50 may further include:

a first dielectric layer 55 configured to transmit an optical signal 500 and disposed between the optical converging device array 51 and the diaphragm array 52 and in the window 520.

That is, the first dielectric layer 55 can be used to separate the optical converging device array 51 and the diaphragm array 52, and also to transmit the optical signal converged by the optical converging device.

Optionally, in the embodiment of the present application, the first dielectric layer 55 is made of a light-transmitting material, such as an organic light-transmitting material. By way of example and not limitation, the first dielectric layer may be a polydimethylsiloxane material.

Optionally, in an embodiment of the present application, the first dielectric layer 55 may be provided with a light shielding layer 57 for shielding an incident optical signal from an adjacent optical image capturing unit, so as to avoid a crosstalk problem caused by the incident light signal from the adjacent optical image capturing unit.

Optionally, as an embodiment, the light shielding layer 57 may be disposed at least one of the following positions:

above the first dielectric layer 55 and between adjacent optical converging devices 510; or in the first dielectric layer 55, where the light shielding layer 57 does not shield a light path of the optical signal 500 within the specific incident angle range in the first dielectric layer 55.

Optionally, in an embodiment of the present application, the optical image sensor 54 may further include:

a metal layer 59 and a second dielectric layer 56. The second dielectric layer 56 is disposed between the diaphragm array 52 and the photosensing units 53, and the metal layer 59 is disposed in the second dielectric layer 56 as an internal connection circuit between the photosensing units 53, and does not shield a light path of the optical signal 500 within the specific incident angle range in the second dielectric layer 56.

Optionally, in the embodiment of the present application, the second dielectric layer 56 is made of a light-transmitting material, such as an inorganic light-transmitting material. By way of example and not limitation, the second dielectric layer 56 may be made of a silicon oxide material.

Figure 5:
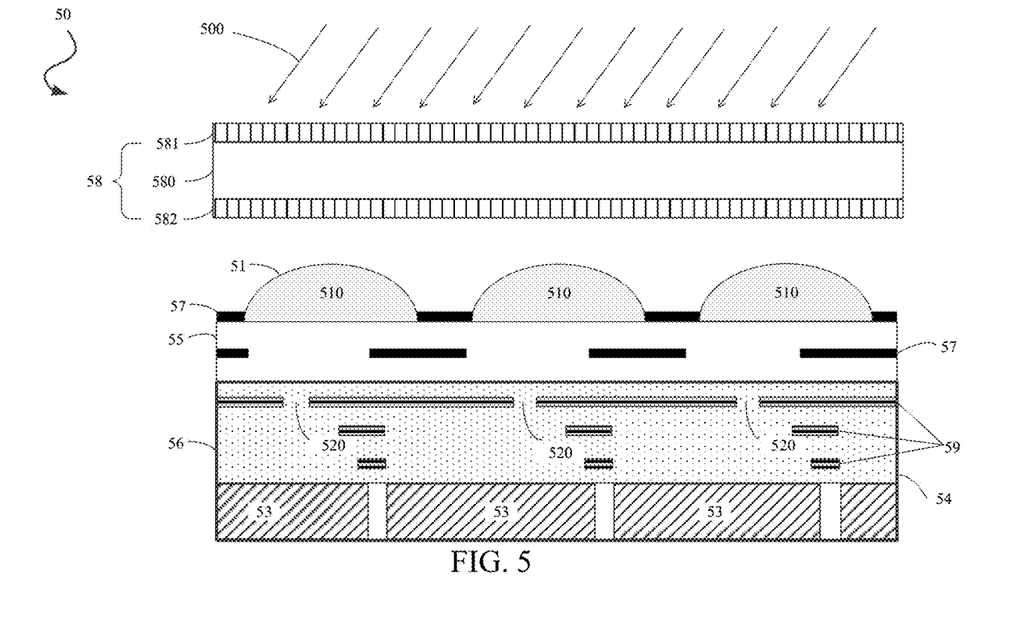
FIG. 5 is a schematic view of an optical image capturing system according to another embodiment of the present application.

Optionally, as an embodiment, a certain layer of the metal layer 59 of the optical image sensor 54 may be directly used as the diaphragm array 52, as long as periodic windows are provided in the metal layer. In this case, the metal layer and the diaphragm array are of the same layer, and FIG. 5 shows a scenario where a top metal layer is of the same layer as a diaphragm array and used as the diaphragm array with only periodic windows 520 provided on the top metal layer. In this case, the first dielectric layer 55 is disposed between the optical converging device array 51 and the second dielectric layer 56 to transmit the optical signal 500 from the optical converging device array 51 to the second dielectric layer 56.

By multiplexing a metal layer of a photosensor as a diaphragm array that shields an optical signal, there is no need to additionally set a separate diaphragm array, which is beneficial to reducing a thickness of an entire optical image capturing system.

Optionally, in an embodiment of the present application, the optical image capturing system 50 may further include:

a filter 58 disposed above the optical converging device array 51 for filtering out an optical signal of a non-target wavelength band and transmitting an optical signal of a target wavelength band (that is, an optical signal of a desired wavelength band for optical image capturing).

Optionally, as an embodiment, the filter 58 includes:

a first filter layer 581 disposed on an upper surface of a substrate 580; and/or a second filter layer 582 disposed on a lower surface of the substrate 580.

Optionally, in the embodiment of the present application, the substrate 580 is made of a transparent material, for example, glass.

Optionally, in some embodiments, a color film may also be plated on the upper surface and/or the lower surface of the substrate 580 to form the filter 58.

Optionally, in some embodiments, a transmittance rate of the filter 58 for an optical signal of a target wavelength band is ≥80%, and a cut-off rate for an optical signal of a non-target wavelength band is ≥80%.

In this embodiment, the diaphragm array and the optical converging device array can be prepared on the basis of an optical image sensor wafer, so as to achieve good alignment accuracy between various components, especially good alignment accuracy between the optical converging device array and the diaphragm array, so that an optical signal within a specific incident angle range passes through the window in the diaphragm array and reaches the photosensing unit.

Figure 6:
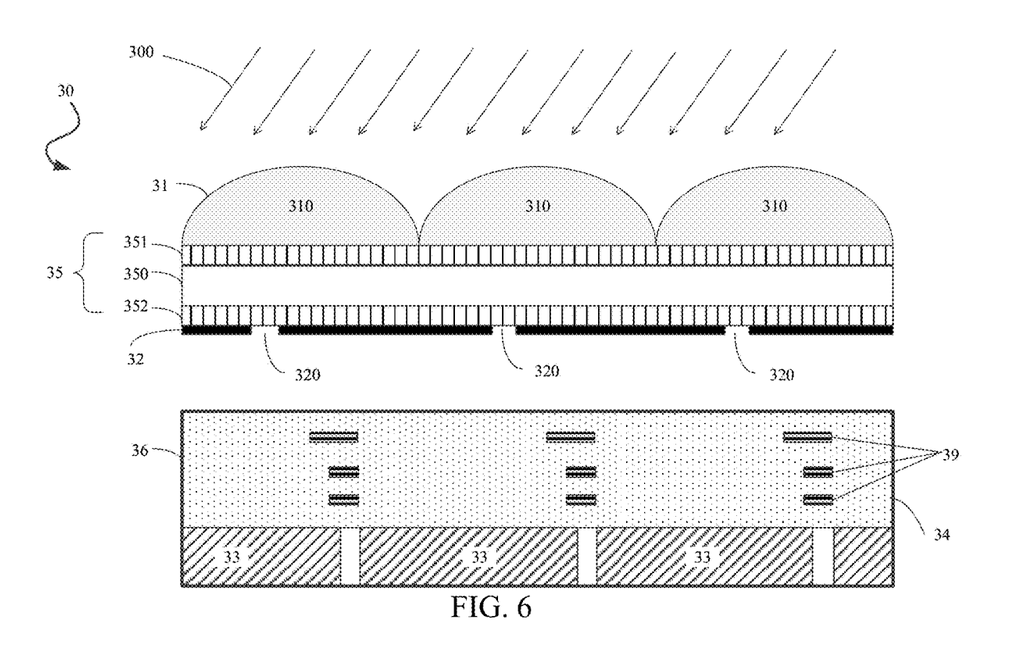
FIG. 6 is a schematic view of an optical image capturing system according to yet another embodiment of the present application.

FIG. 6 is a schematic structural view of an optical image capturing system 30 according to another embodiment of the present application. As shown in FIG. 6, the optical image capturing system 30 includes:

an optical converging device array 31 including a plurality of optical converging devices 310;

a diaphragm array 32 in which windows 320 are provided; and an optical image sensor 34 including a plurality of photosensing units 33.

The optical converging device 310, the window 320 and the photosensing unit 33 may respectively correspond to the optical converging device 21 or 510, the window 220 or 520, and the photosensing unit 23 or the photosensing unit 53 described above. For detailed description, reference may be made to the foregoing embodiments, and details are not described herein again.

Optionally, in some embodiments of the present application, the optical image sensor 34 may further include a metal layer 39 and a second dielectric layer 36, which may respectively correspond to the metal layer 59 and the second dielectric layer 56 described above, and details are not described herein again.

Optionally, in an embodiment of the present application, the optical image capturing system 30 may further include:

a filter 35 disposed between the optical converging device array 31 and the optical image sensor 34 for filtering out an optical signal of a non-target wavelength band and transmitting an optical signal of a target wavelength band.

Optionally, as an embodiment, the filter 35 includes:

a first filter layer 351 disposed on an upper surface of a substrate 350; and/or a second filter layer 352 disposed on a lower surface of the substrate 350.

Optionally, in the embodiment of the present application, the substrate 350 is made of a transparent material, for example, glass.

Optionally, in some embodiments, a color film may also be plated on the upper surface and/or the lower surface of the substrate 350 to form the filter 35.

Optionally, in some embodiments, a transmittance rate of the filter 35 for an optical signal of a target wavelength band is ≥80%, and a cut-off rate for an optical signal of a non-target wavelength band is ≥80%.

It should be understood that, in this embodiment, the substrate 350 may be a substrate of the optical converging device 310. For example, if the optical converging device is a micro lens, the substrate 350 may be a substrate for preparing the micro lens. In specific implementation, first of all, the first filter layer and/or the second filter layer may be provided on the surface of the substrate, or a filter coating may be provided, and then a micro lens array may be prepared on the upper surface of the filter 35. Optionally, as an embodiment, the diaphragm array 32 may be disposed on the lower surface of the filter 35. In some embodiments, the diaphragm array may be a black adhesive material, and thus the lower surface of the filter 35 may be coated with a black adhesive material, and periodic windows are provided in the black adhesive material to form the diaphragm array.

Optionally, as another embodiment, the diaphragm array 32 may be disposed below the filter 35 without contacting the filter 35, that is, the diaphragm array 32 is an independent component.

Figure 7:
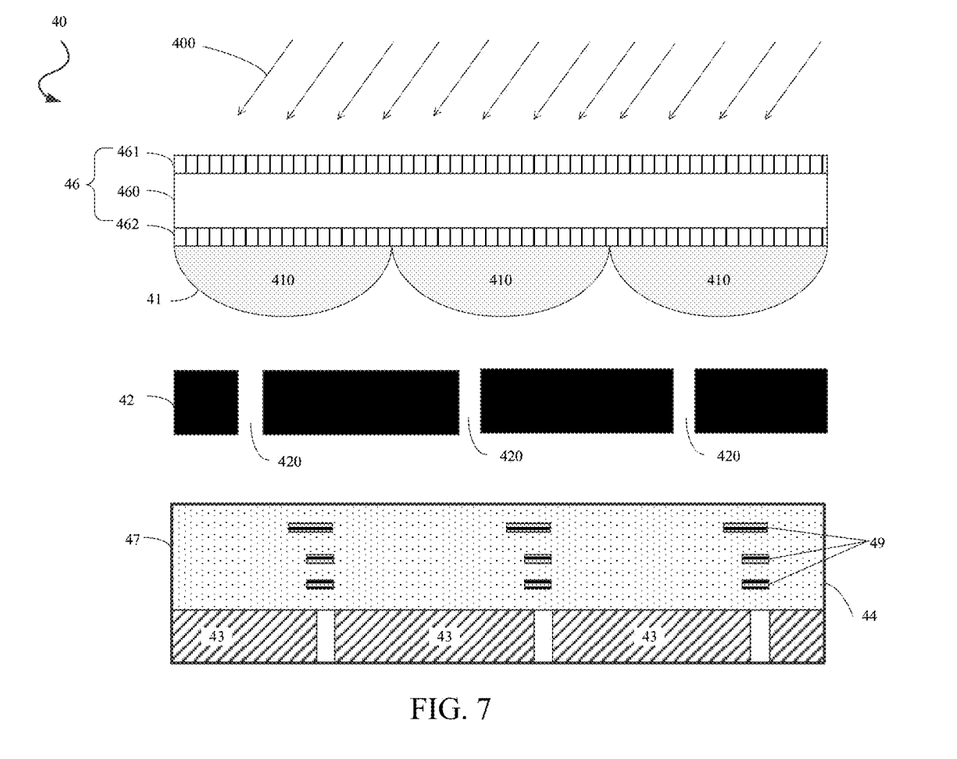
FIG. 7 is a schematic view of an optical image capturing system according to yet another embodiment of the present application.

FIG. 7 is a schematic structural view of an optical image capturing system 40 according to yet another embodiment of the present application. As shown in FIG. 7, the optical image capturing system 40 includes:

an optical converging device array 41 including a plurality of optical converging devices 410;

a diaphragm array 42 in which windows 420 are provided; and an optical image sensor 44 including a plurality of photosensing units 43.

The optical converging device 410, the window 420 and the photosensing unit 43 may respectively correspond to the optical converging device 21, the window 220 and the photosensing unit 23 described above. For detailed description, reference may be made to the foregoing embodiment, and details are not described herein again.

Optionally, in some embodiments of the present application, the optical image sensor 44 may further include a metal layer 49 and a second dielectric layer 47, which may respectively correspond to the metal layer 59 and the second dielectric layer 56 described above, and details are not described herein again.

Optionally, in an embodiment of the present application, the optical image capturing system 40 may further include:

a filter 46 disposed above the optical converging device array 41 for filtering out an optical signal of a non-target wavelength band and transmitting an optical signal of a target wavelength band.

Optionally, as an embodiment, the filter 46 includes:

a first filter layer 461 disposed on an upper surface of a substrate 460; and/or a second filter layer 462 disposed on a lower surface of the substrate 460.

It should be understood that the filter 46 may correspond to the filter 35 in the foregoing embodiment. For detailed description, reference may be made to the related description in the foregoing embodiment, and details are not described herein again.

Unlike the embodiments shown in FIGS. 4 to 6, the embodiment in FIG. 7 shows that the diaphragm array 42 is an independent component, that is, the diaphragm array 42 is not in contact with other components in the optical image capturing system 40.

Optionally, a preparation process of the independent diaphragm array 42 includes, but is not limited to, 3D printing, nano-imprinting, via-hole etching, and the like.

The following uses the optical image capturing system shown in FIG. 5 as an example to describe a preparation process of an optical image capturing system. It should be understood that this is merely an example and should not be construed as limitation to an embodiment of the present application.

Firstly, the photosensing units 53 as well as the second dielectric layer 56 and the metal layer 59 are prepared. Then, periodic windows 520 are provided in the top metal layer, and the top metal layer is used as a diaphragm array. Then, the first dielectric layer 55 is prepared above the second dielectric layer 56. Further, the optical converging device array 51 such as a micro lens array is prepared above the first dielectric layer 55. In addition, the filter 58 may be further provided above the optical converging device array 51.

It should be understood that, in the embodiment of the present application, the optical image capturing system may further include a support structure for supporting the optical image capturing system, and a corresponding processing chip and the like, which is not limited in the embodiment of the present application.

Figure 8:
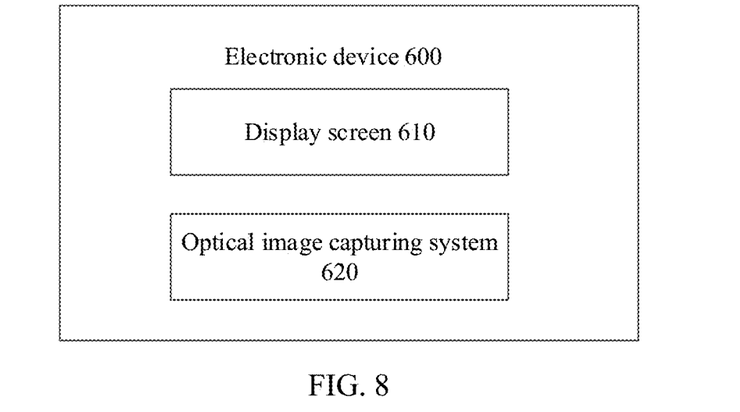
FIG. 8 is a schematic view of an electronic device according to an embodiment of the present application.

An embodiment of the present application further provides an electronic device. As shown in FIG. 8, the electronic device 600 may include a display screen 610 and an optical image capturing system 620, and the optical image capturing system 620 is disposed under the display screen 610.

It should be understood that the optical image capturing system 620 may be an optical image capturing system composed of a plurality of the optical image capturing units 20, or the optical image capturing system 30, the optical image capturing system 40, or the optical image capturing system 50 described above. For specific description, reference may be made to the foregoing embodiments, and details are not described herein again.

The electronic device 600 may be any electronic device having a display screen. For the display screen 610, reference may be made to the related implementation manners of the display screen 120 in FIG. 1 or FIG. 2, such as an OLED display screen or other display screens. For brevity, details are not described herein again.

Optionally, in an embodiment of the present application, the display screen 610 may be specifically a self-light-emitting display screen (such as an OLED display screen), and includes a plurality of self-light-emitting display units (such as OLED pixels or OLED light sources). When the optical image capturing system is a biometric identification system, a part of the self-light-emitting display units in the display screen can be used as an excitation light source of the biometric identification system for biometric identification to emit an optical signal to a biometric detecting region for biometric detection.

It should be noted that specific examples in embodiments of the present application are just for helping those skilled in the art better understand the embodiments of the present application, rather than for limiting the scope of the present application.

It should be understood that terms used in embodiments of the present application and the claims appended hereto are merely for the purpose of describing particular embodiments, and are not intended to limit the embodiments of the present application. For example, the use of a singular form of "a", "the" and "said" in the embodiments of the present application and the claims appended hereto are also intended to include a plural form, unless otherwise clearly indicated herein by context.

Those of ordinary skill in the art may be aware that, units of the examples described with reference to the embodiments disclosed in this paper may be implemented by electronic hardware, computer software, or a combination of the two. To clearly illustrate interchangeability between the hardware and the software, the foregoing has generally described composition and steps of the examples according to functions. Whether these functions are performed by hardware or software depends on specific applications and designed constraint conditions of technical solutions. Persons skilled in the art may use different methods to implement the described functions for every particular application, but it should not be considered that such implementation goes beyond the scope of the present application.

In several embodiments provided in the present application, it should be understood that, the disclosed system and apparatus may be implemented in other manners. For example, the described apparatus embodiment is merely an example. For example, unit division is merely logical function division and may be other division in actual implementation. For example, a plurality of units or components may be combined or integrated into another system, or some features may be ignored or not performed. In addition, displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Part of or all of the units here may be selected according to a practical need to achieve the objectives of solutions of the embodiments of the present application.

In addition, functional units in the embodiments of the present application may be integrated into a processing unit, or each unit may exist alone physically, or two or more than two units may be integrated into one unit. The above integrated unit may be implemented in a form of hardware, or may be implemented in a form of a software functional unit.

If the integrated unit is implemented in the form of a software functional unit and is sold or used as an independent product, it may be stored in a computer readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The foregoing storage medium includes: various media capable of storing program codes, such as a U disk, a mobile hard disk, a read-only memory (ROM), a random access memory (RAM), a disk, an optical disk or the like.

The foregoing description is merely specific implementations of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

What is claimed is:

1. An optical image capturing unit, comprising:
    an optical converging device;
    a first dielectric layer configured to transmit an optical signal within a specific incident angle range returned by reflection or scattering of a finger above a display screen and disposed under the optical converging device;
    a light shielding layer, disposed in the first dielectric layer, the light shielding layer being provided with an opening, and the light shielding layer is configured to shield an incident optical signal from an adjacent optical image capturing unit;
    a second dielectric layer disposed under the first dielectric layer;
    a diaphragm disposed on a back focal plane of the optical converging device and disposed in the second dielectric layer, wherein the diaphragm is provided with a window, a focal point of the optical converging device is located in the window, a diameter of the opening of the light shielding layer is larger than a diameter of the window of the diaphragm, the second dielectric layer comprises a multi-layer metal layer, the diaphragm is configured to be a top metal layer in the multi-layer metal layer, and the multi-layer metal layer is configured to be an internal connection circuit of a photosensing unit; and
    the photosensing unit disposed under the second dielectric layer,
    wherein, the optical converging device is configured to converge the optical signal to the window, and the optical signal is transmitted to the photosensing unit via the window.

2. The optical image capturing unit according to claim 1, wherein the window is not directly facing an optical axis of the optical converging device.

3. The optical image capturing unit according to claim 1, wherein the specific incident angle range is $\theta \pm \Delta\theta$, where $\theta$ is not equal to zero, and $\Delta\theta$ is determined according to a size of the window.

4. The optical image capturing unit according to claim 1, wherein the optical image capturing unit further comprises:
    a filter disposed above the photosensing unit for filtering out an optical signal of a non-target wavelength band and transmitting an optical signal of a target wavelength band.

5. The optical image capturing unit according to claim 4, wherein the filter is disposed between the optical converging device and the diaphragm, or the filter is disposed above the optical converging device.

6. The optical image capturing unit according to claim 4, wherein the filter comprises:
   a first filter layer disposed on an upper surface of a substrate.

7. The optical image capturing unit according to claim 4, wherein the filter comprises:
   a second filter layer disposed on a lower surface of the substrate.

8. The optical image capturing unit according to claim 4, wherein the filter comprises:
   a first filter layer disposed on an upper surface of a substrate; and
   a second filter layer disposed on a lower surface of the substrate.

9. The optical image capturing unit according to claim 1, wherein the optical signal detected by the photosensing unit is used to form a pixel of a captured image.

10. The optical image capturing unit according to claim 1, wherein the optical converging device is a convex lens or a Fresnel lens.

11. The optical image capturing unit according to claim 1, wherein a distance by which the window deviates from an optical axis of the optical converging device is set such that a parallel optical signal within the specific incident angle range passes through the window.

12. The optical image capturing unit according to claim 1, wherein the diaphragm is configured to have a distance from the light blocking layer.

13. An electronic device, comprising:
   a display screen, and
   an optical image capturing system, wherein the optical image capturing system comprises an array of a plurality of the optical image capturing units, the optical image capturing unit comprises: an optical converging device; a first dielectric layer configured to transmit an optical signal within a specific incident angle range returned by reflection or scattering of a finger above a display screen and disposed under the optical converging device; a light shielding layer, disposed in the first dielectric layer, the light shielding layer being provided with an opening, and the light shielding layer is configured to shield an incident optical signal from an adjacent optical image capturing unit a second dielectric layer disposed under the first dielectric layer; a diaphragm disposed on a back focal plane of the optical converging device and disposed in the second dielectric layer, wherein the diaphragm is provided with a window, a focal point of the optical converging device is located in the window, a diameter of the opening of the light shielding layer is larger than a diameter of the window of the diaphragm, the second dielectric layer comprises a multi-layer metal layer, the diaphragm is configured to be a top metal layer in the multi-layer metal layer, and the multi-layer metal layer is configured to be an internal connection circuit of a photosensing unit; and the photosensing unit disposed under the second dielectric layer;
   wherein the optical converging device is configured to converge the optical signal to the window, and the optical signal is transmitted to the photosensing unit via the window; and
   wherein the optical image capturing system is disposed under the display screen.

14. The electronic device according to claim 13, wherein the display screen is an organic light-emitting diode display screen, and a light-emitting layer of the display screen comprises a plurality of organic light-emitting diode light sources, wherein when the optical image capturing system is a biometric identification system, the biometric identification system employs at least some of the organic light-emitting diode light sources as an excitation light source for biometric identification.

* * * * *